US008003301B2

(12) United States Patent
Imai et al.

(10) Patent No.: US 8,003,301 B2
(45) Date of Patent: Aug. 23, 2011

(54) MANUFACTURING METHOD FOR SEMICONDUCTOR DEVICE

(75) Inventors: Akira Imai, Tokyo (JP); Masaaki Shinohara, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 863 days.

(21) Appl. No.: 12/003,887

(22) Filed: Jan. 3, 2008

(65) Prior Publication Data

US 2008/0171291 A1 Jul. 17, 2008

(30) Foreign Application Priority Data

Jan. 11, 2007 (JP) .................................. 2007-003033

(51) Int. Cl.
*G03F 7/26* (2006.01)
(52) U.S. Cl. .............................. 430/312; 430/5; 430/394
(58) Field of Classification Search .................. 430/311, 430/5, 313, 322, 394
See application file for complete search history.

(56) References Cited

U.S. PATENT DOCUMENTS

| 6,998,201 | B2 * | 2/2006 | Koike ................................ 430/5 |
| 2007/0018286 | A1 * | 1/2007 | Chen ............................. 257/640 |

FOREIGN PATENT DOCUMENTS

JP 11-135417 5/1999

OTHER PUBLICATIONS

Colburn, M. et al., "Process Challenges for Extension of H2O Immersion Lithography to Hyper-NA." Sematech Litho Forum, May 22, 2006. IBM Corporation 2004.
Arnold, Bill. "ASML ArF Immersion Tool Development and Status." Sematech Litho Forum, Vancouver, May 23, 2006.
Kameyama, M. "ArF Immersion and Extension." Nikon Corporation. The 2006 Litho Forum, May 23, 2006.
Schellenberg, Franklin M. "Managing RET Complexity Under Immersion." Mentor Graphics. Sematech Litho Forum, May 23, 2006.
Hendrickx, Eric, et al. "Complementary dipole exposure solutions at 0.29 k1." Proceedings of SPIE 2005, vol. 5754-32.
Maenhoudt, M. et al. "Double Patterning scheme for sub-0.25 k1 single damascene structures at NA=0.75." Proceeding of SPIE 2006, vol. 5754-203.
Lim, Chang-Moon et al. "Positive and Negative Tone Double Patterning Lithography for 50nm Flash Memory." Proceedings of SPIE 2006, vol. 6154-37.

* cited by examiner

*Primary Examiner* — Kathleen Duda
*Assistant Examiner* — Caleen O Sullivan
(74) *Attorney, Agent, or Firm* — McDermott Will & Emery LLP

(57) ABSTRACT

A manufacturing method for a semiconductor device having patterns including two adjacent sides forming a corner portion with an external angle and a periodic pattern with a high density arrangement in the same layer is provided with (a) the step of exposing the first divided pattern including a first side which is obtained by dividing the pattern including two sides and the region which corresponds to a first thinned out pattern from which the periodic pattern is thinned out to light through a first mask having a first mask pattern, and (b) the step of exposing the second divided pattern including a second side which is obtained by dividing the pattern including two sides and the region which corresponds to a second thinned out pattern which is obtained by thinning out the periodic pattern to light through a first mask having a second mask pattern.

8 Claims, 12 Drawing Sheets

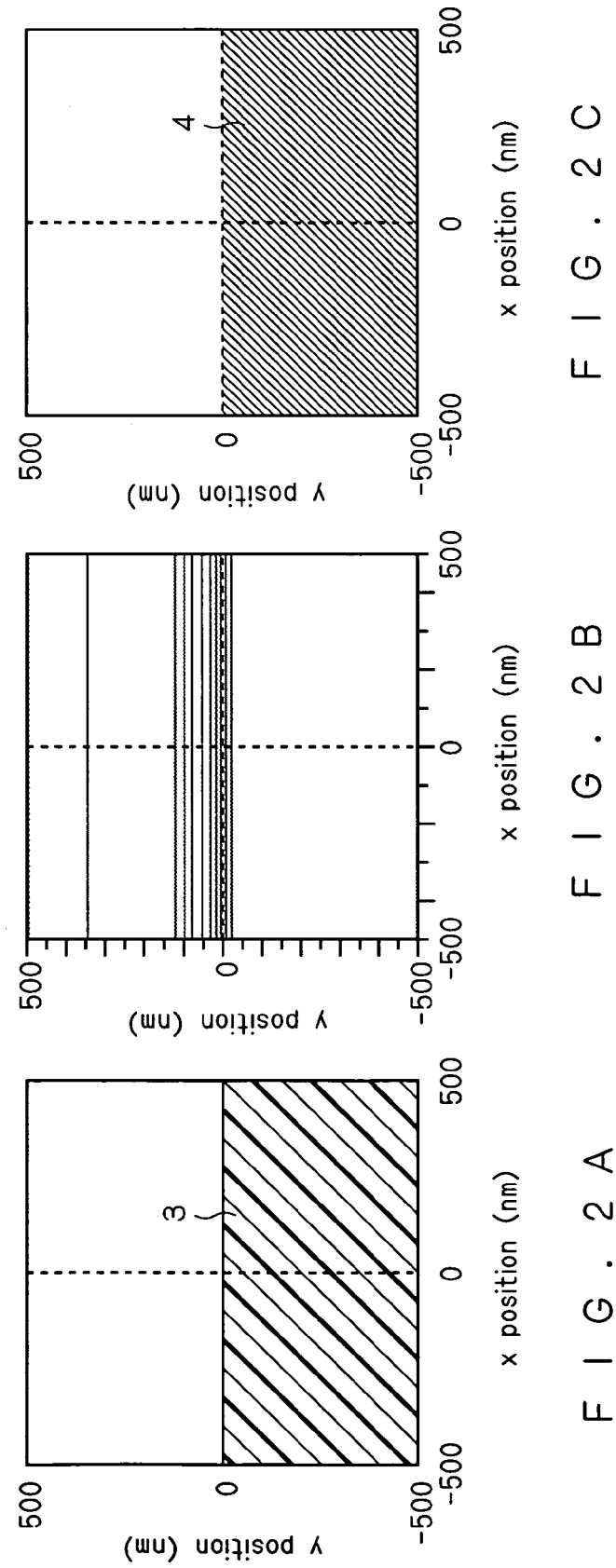

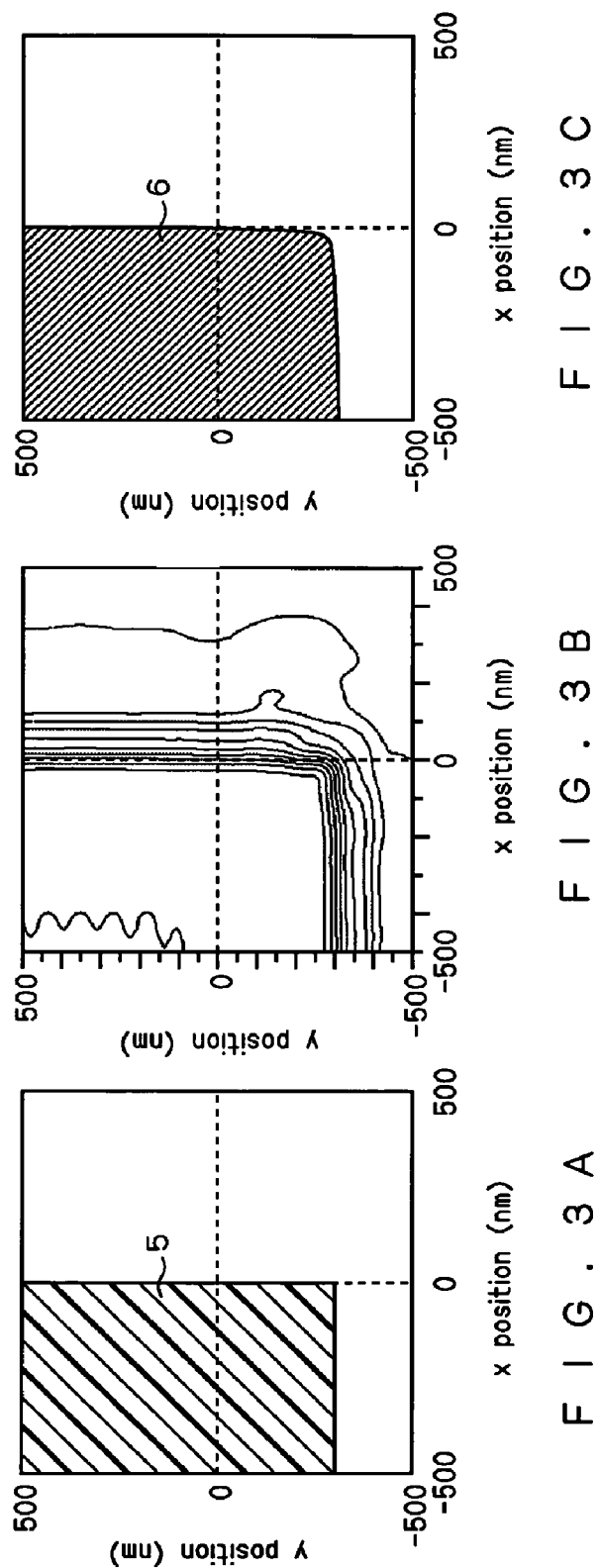

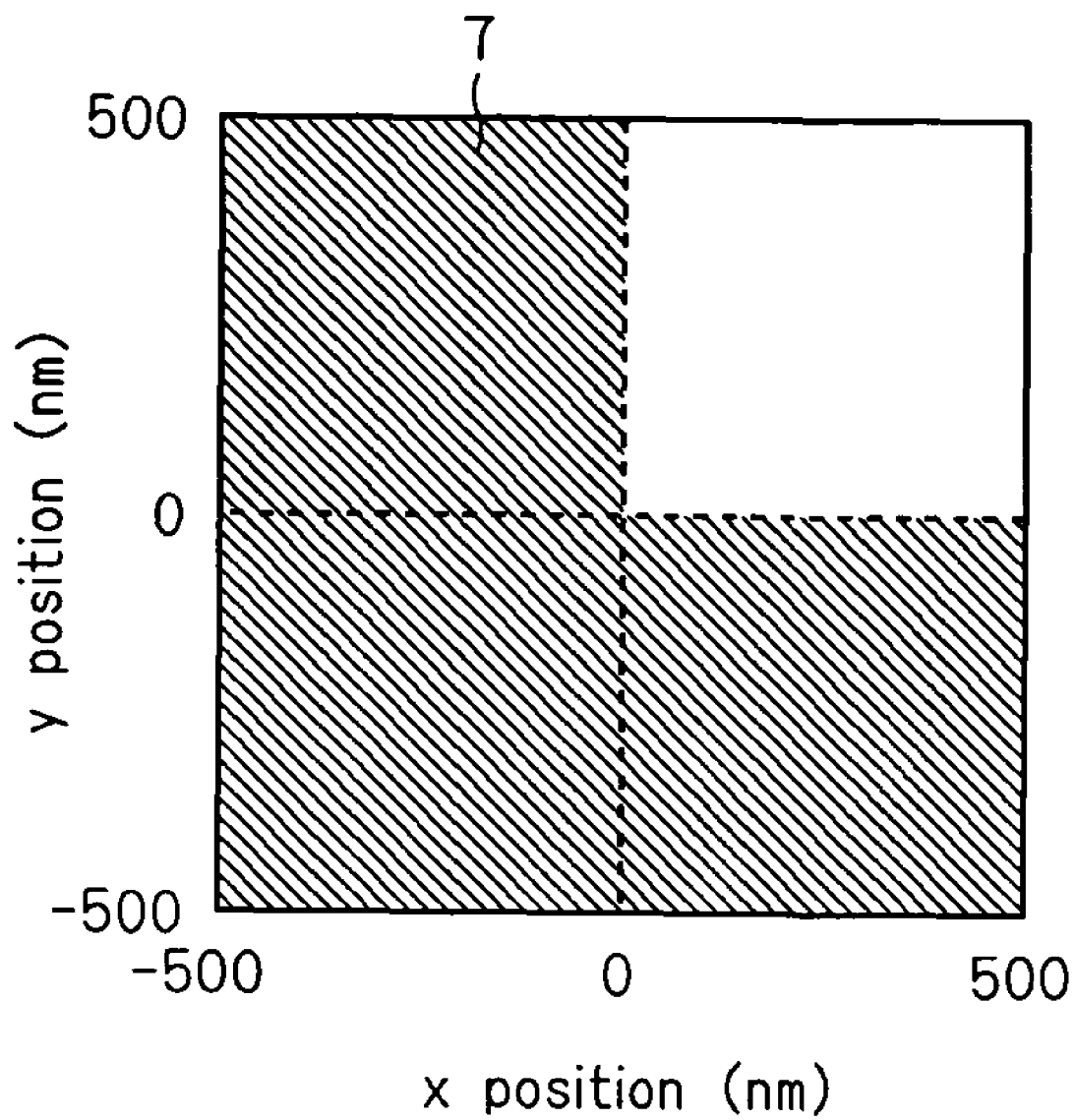

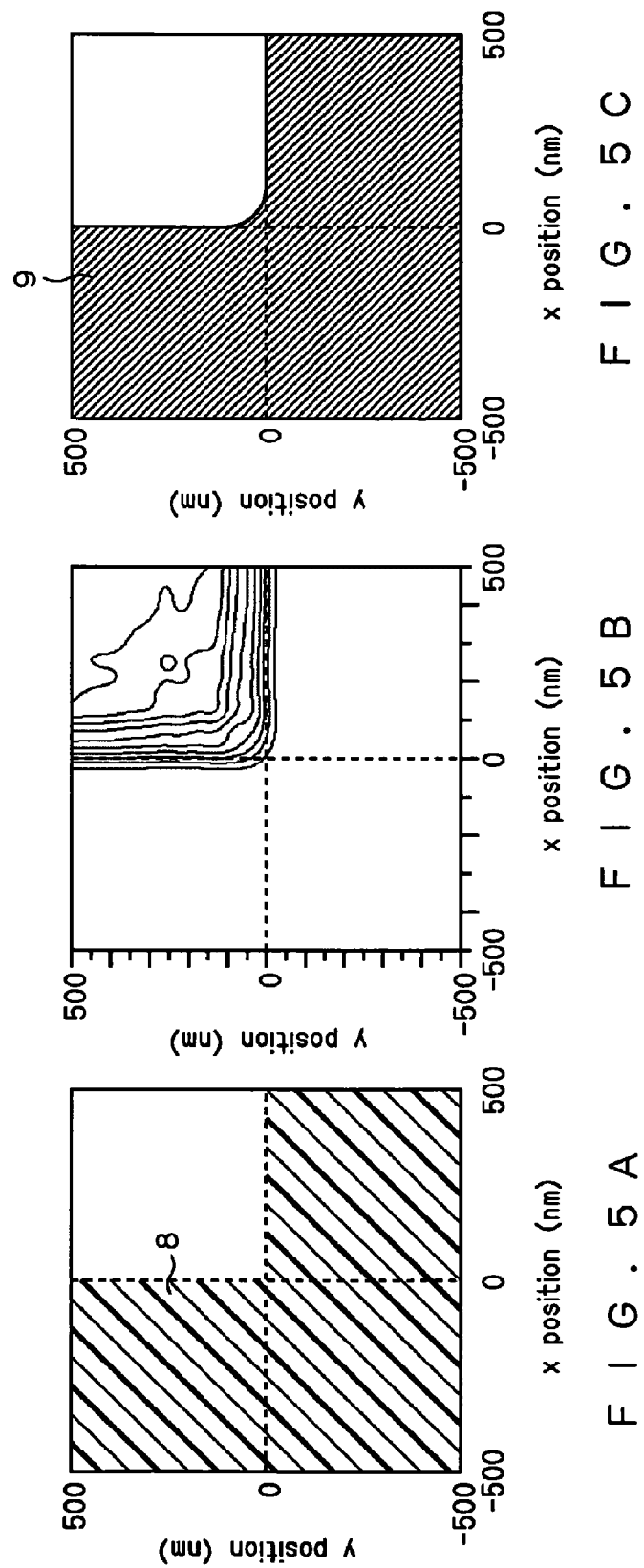

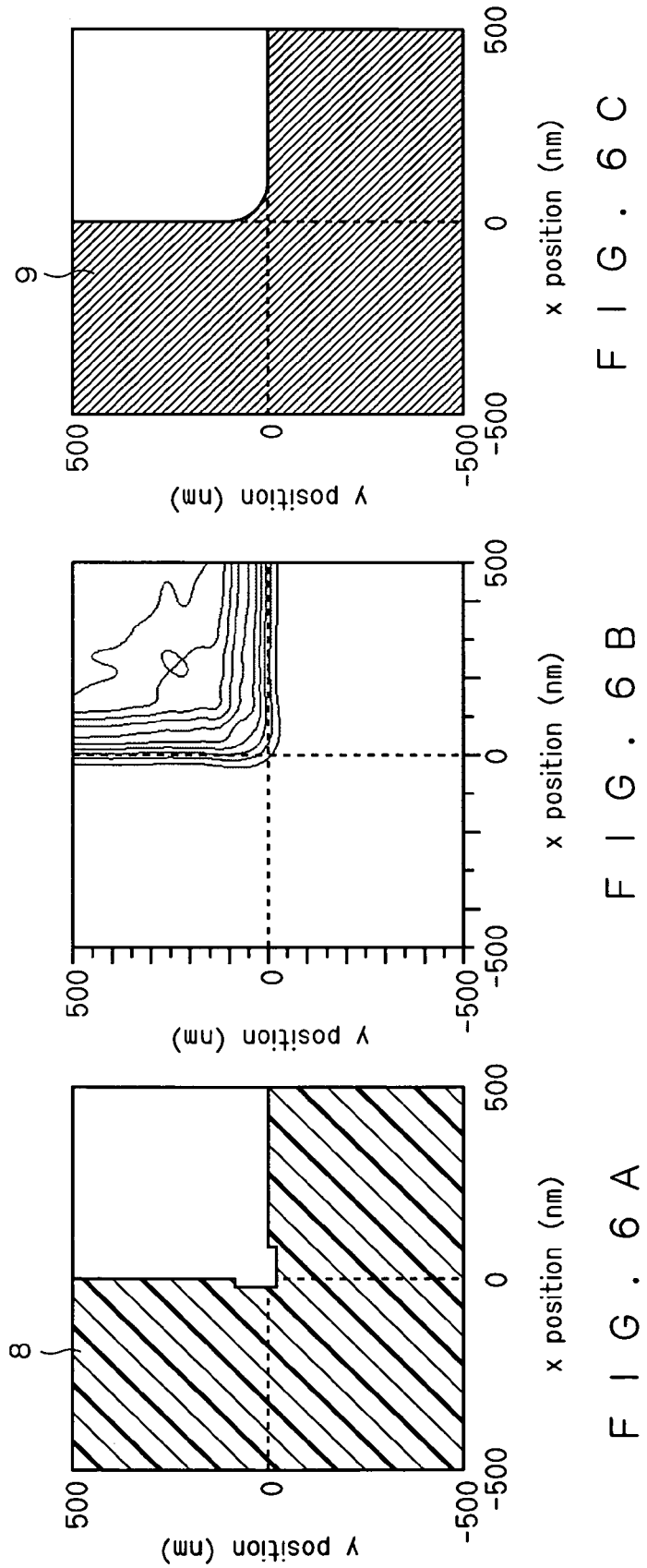

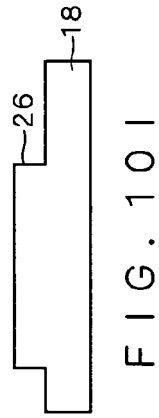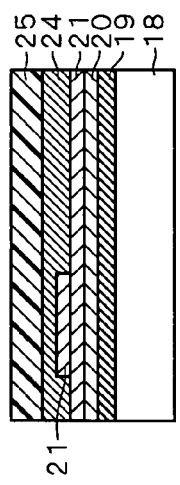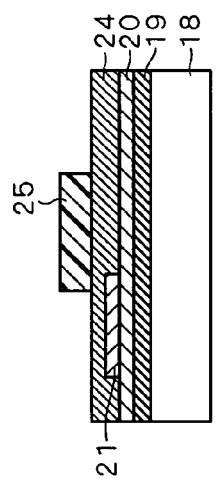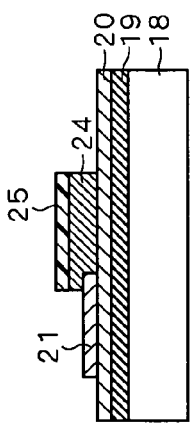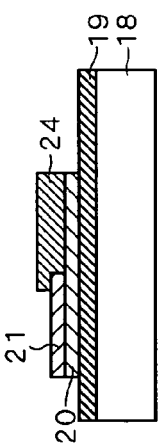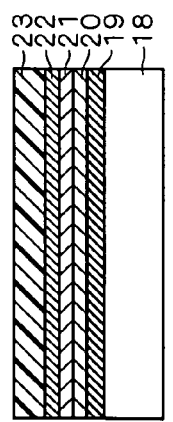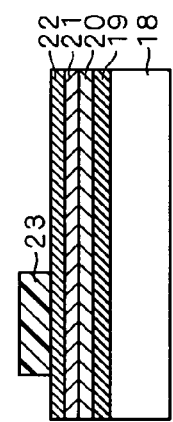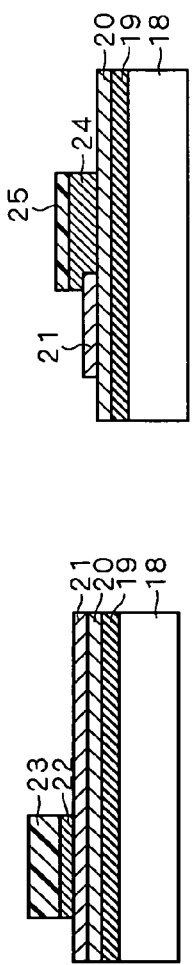

MANUFACTURING METHOD FOR SEMICONDUCTOR DEVICE

BACKGROUND OF THE INVENTION

1. Field of the Invention

The present invention relates to a manufacturing method for a semiconductor device.

2. Description of the Background Art

Miniaturization in a lithographic technology has progressed by using light for exposure with a shorter wavelength and increasing the numerical aperture (NA value) of the imaging optical system in a stepper. Specifically, the wavelength of light for exposure has been shortened from the I line (wavelength: 365 nm), to the KrF excimer laser beam (wavelength: 248 nm), and then to the ArF excimer laser beam (wavelength: 193 nm). In addition, the NA value has gradually increased up to a value of approximately 0.9, and furthermore, an NA value of 1 or greater has been realized by filling up the space between the projection lens and the substrate with water so that the space soaks up a liquid.

In response to the above, according to the roadmap for progressing further miniaturization, the minimum pitch used for semiconductor devices has become such that hp (half pitch): 65 nm→hp: 45 nm→hp: 32 nm in order to reduce the dimensions of the pattern. Here, two mass production tools for transcribing a pattern with hp: 32 nm, exposure to EUV light, and exposure to ArF light with the space between the projection lens and the substrate soaked with a liquid are considered to be promising. However, it is considered that the unit for mass production for exposure to EUV light will not be made by the time mass production starts, judging from the schedule for developing a device, and therefore, it is examined that exposure to ArF light with the space between the projection lens and the substrate soaked with a liquid is kept being used and applied. It is considered that the maximum limit of the NA value using water (index of refraction: 1.43) as the liquid with which the space is soaked is 1.3 to 1.35, and the theoretical limit value of the minimum pitch that can be transcribed with this NA value is K1×wavelength/NA=0.25× 193/1.35=35.7 nm, and thus, patterns with hp: 32 nm cannot be transcribed.

In addition, location patterns with the minimum pitch are formed under such processing conditions that the pitch is no less than approximately 0.35 when calculated as a k1 factor (here, k1 is a process factor) in accordance with a conventional SOC process, while patterns with a minimum pattern pitch of 90 nm of which the application is examined for the wire layers of hp 32 nm node SOC are formed under such processing conditions that k1=approximately 0.3 close to the theoretical limit value k1=0.25 due to the stepper that can be applied, and it becomes very difficult to build a pattern in an arbitrary form, for example a logic wiring pattern, under such process conditions that k1=approximately 0.3.

In these circumstances, exposure to ArF light with the space between the projection lens and the substrate soaked with a liquid+double patterning technology is examined as a lithographic technology corresponding to 32 nm node SOC. That is to say, a pattern transcription method is examined, where the mask pattern is divided into a number of patterns so that the pattern pitch of the desired circuit pattern to be transcribed onto a substrate need not be so precise as when patterns are formed under such processing conditions that k1=approximately 0.35, and the divided mask patterns are exposed to light through multiple exposure, or multiple processing is carried out on the divided mask patterns.

Specifically, a method is examined where when pattern arrangements in an arbitrary form, for example wiring patterns of SOC, are presupposed, in the case where, k1>approximately 0.35 in the formula CD=k1×wavelength of light for exposure/NA (here, CD is the resolution and NA is the numeric aperture) for the resolution, the pitch in the pattern arrangement is CD×2 or greater, making transcription possible through one-time exposure to light, even when the pattern is not divided, while in the case of k1<approximately 0.35, it becomes more difficult to transcribe a pattern where the pitch in the arrangement of the pattern is than CD×2 or more through one-time exposure to light, and therefore, the mask pattern is divided so that the pitch in the pattern arrangement need not be so precise.

In addition, there are several methods in a pattern dividing method in accordance with the double patterning method, and there are methods according to which a pattern is divided into two masks in such a manner that every other line thinned out in a periodic pattern of an arrangement with high density, as described above, and the mask pattern is divided in two, one for the components in the direction x and the other for the components in the direction y, in the case where two-dimensional circuit patterns are arranged with high density in the same layer. As for these divided mask patterns, a desired pattern can be formed through multiple exposure to light or multiple processing, for example exposure to light→processing→exposure to light→processing.

As such a pattern transcription method, there is a method according to which a pattern figure with the pitch of the resolution limit or smaller is divided so that the arrangement makes it so that the pitch need not be so precise up to the level that the pattern can be resolved. In the case where a pattern with 32 mL/S (hp=32 nm), which is finer than the theoretical resolution limit value hp=37 nm, is processed under such conditions that ArF light is used with NA=1.20, for example, the mask pattern is divided in two with a line of 32 nm and a pitch of 128 nm by removing every other line. This is used for multiple exposure to light and multiple processing, and thus, a desired pattern is formed (see for example SEMATECH Litho Forum 2006 conference proceedings, Proceedings of SPIE 2005, vol. 5754-32, Proceedings of SPIE 2006, vol. 5754-203 and Proceedings of SPIE 2006, vol. 6154-37).

In addition, there is a multiple exposure to light method using an electron beam exposure method according to which a portion where lines are bent in the pattern is used as a border for division and a double exposure portion is provided in acute angle portions from among portions where lines are bent in the pattern, or a non-exposure portion is provided in obtuse angle portions for correction, and thus, a desired pattern is formed (see for example Japanese Patent Application Laid-Open No. 11 (1999)-135417).

In accordance with pattern transcription methods using a conventional double patterning method, whether or not the mask pattern is divided is determined on the basis of the density of the pattern inside the same layer. That is to say, patterns of which the density is so high as to be difficult or impossible to transcribe through one-time exposure to light, for example patterns with hp 32 nm, are divided for multiple exposure to light or multiple processing, while patterns with a low density are not divided, and transcribed through one-time exposure to light.

Due to the nature of pattern formation, however, corner portions are rounded due to the intensity of light when a pattern including two adjacent sides forming a corner portion is transcribed onto a substrate through one-time exposure to light. For example, in the case where an active region pattern which forms a rectangular corner portion and a gate pattern above an activation pattern and in the vicinity of the corner portion are arranged in a similar relationship between an active region pattern and a gate pattern in a MOS transistor, the active region having a low pattern density is transcribed through one-time exposure to light, and the corner of the active region pattern is rounded. The gate pattern is positioned against the corner portion of the active region pattern for overlapping processes, and therefore, when the corners of the active pattern are rounded, causing the location of the gate pattern to shift, a problem arises, such that the properties of the transistors fluctuate. As a technique for preventing the corner portions from being rounded as described above, there is a technology for correction through optical proximity effects, but there is a limit in terms of prevention of rounding using this method.

In addition, although in order to secure a margin for inconsistency in the properties of the transistors, measures are taken by securing an extra margin for the operation, and arranging the transistors in the layout at a sufficient distance to such a degree that there is no inconsistency in terms of the properties, these measures have problems, such that the properties of the chip deteriorate and the area of the chip expands.

In addition, in accordance with a multiple exposure method using an electron beam method, a mask with a complex form must be used, in order to correct the amount of dosage of electrons, due to the proximity effect, and it is assumed that no hard mask is used, and therefore, a problem arises with the precision in the mask arrangement and cost.

SUMMARY OF THE INVENTION

An object of the present invention is to obtain a manufacturing method for a semiconductor device where corner portions in the pattern can be prevented from being rounded, and thus, the properties of the transistors can be prevented from varying by determining whether or not multiple exposure to light and multiple processing are used when the mask pattern is divided on the basis of the density of the patterns in different layers in a pattern transcribing method in the manufacturing method for a semiconductor device.

The manufacturing method for a semiconductor device having a pattern for two sides which are adjacent to each other, forming a corner portion with an external angle, and a periodic pattern arranged with high density in the same layer according to one embodiment of the present invention includes the following steps (a) and (b).

The step (a) is a step of exposing regions which correspond to a first divided pattern, including the first side obtained by dividing the pattern for two sides, and a first thinned out pattern obtained by thinning out the periodic pattern to light using a first mask having a first mask pattern.

The step (b) is a step of exposing regions which correspond to a second divided pattern, including the second side obtained by dividing the pattern for two sides, and second thinned out pattern obtained by thinning out the periodic pattern to light using a second mask having a second mask pattern.

Patterned edges in a first direction and patterned edges in a second direction are transcribed through separate exposure to light so as to overlap, and then processed, and thus, the corner portions in the pattern can be prevented from being rounded. In the case where this method for exposure to light is applied to the process for the active regions patterned for MOS transistors, such a problem that the properties of the transistors vary due to the positional shifting of the gate pattern, which is positioned relative to the corner portions of the active regions in this pattern before overlapping and being processed, can be solved.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 2A to 2C are diagrams showing the step of exposure to light according to the first embodiment of the first invention;

FIGS. 3A to 3C are diagrams showing the step of exposure to light according to the first embodiment of the first invention;

FIG. 4 is a diagram showing a pattern transcribed through the step of exposure to light according to the first embodiment of the first invention;

FIGS. 5A to 5C are diagrams showing the step of exposure to light according to a related art;

FIGS. 6A to 6C are diagrams showing the step of exposure to light according to the related art;

FIGS. 10A to 10I are diagrams showing the pattern transcribing process according to the second embodiment of the present invention;

DESCRIPTION OF THE PREFERRED EMBODIMENTS

First Embodiment

Figure 1:
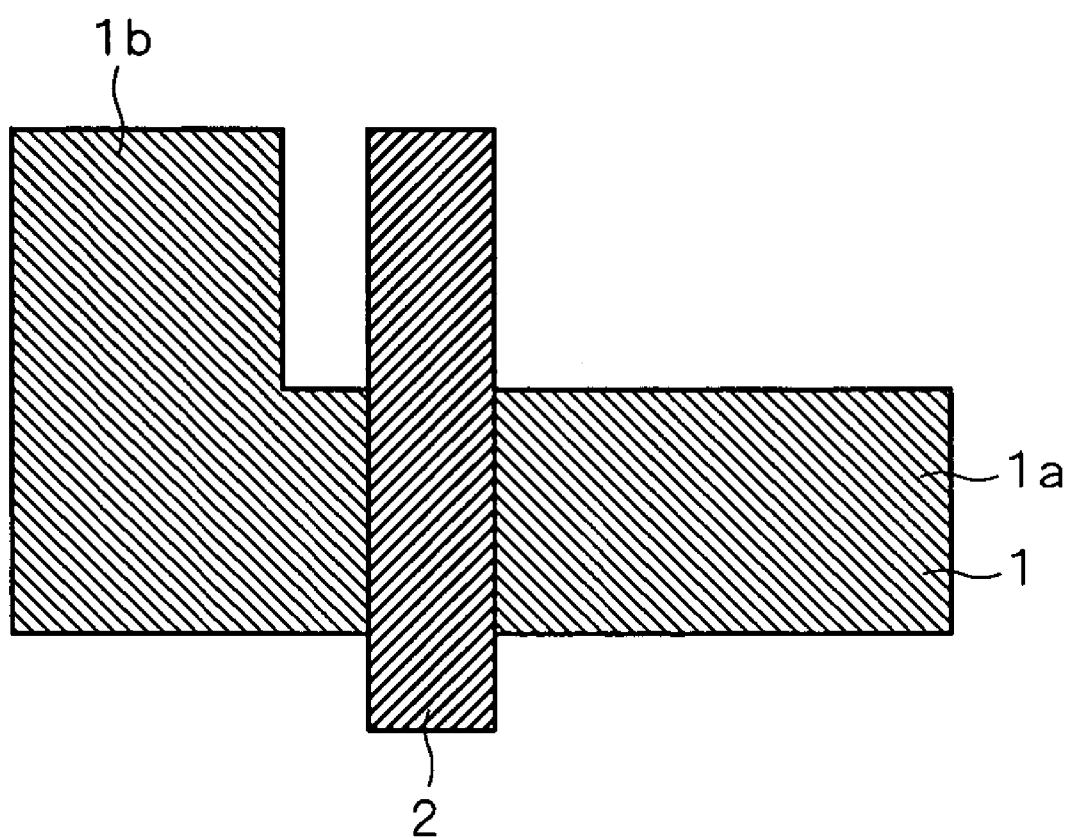
FIG. 1 is a diagram showing a pattern transcribed onto a semiconductor device according to a first embodiment of the present invention.

FIG. 1 is a diagram showing a pattern transcribed onto a substrate of a semiconductor device according to the first embodiment of the present invention, and this pattern transcribing method is described in the following with reference to the diagrams.

FIG. 1 is a diagram showing an example of a layout pattern for a MOS transistor, where an active region pattern 1 including first and second sides 1a and 1b which are adjacent, forming a corner portion with an external angle of 90 degrees is arranged, and a gate pattern 2 is arranged above this active region pattern 1 and in proximity to the corner portion. Here, although an active region pattern of a MOS transistor forming a corner portion with an external angle of 90 degrees is described in the present embodiment, the pattern may form a corner portion with an external angle of less than 180 degrees.

Next, a method for transcribing the active region pattern 1 is described.

Here, in accordance with conventional pattern transcribing methods, the mask pattern is divided on the basis of the density of the pattern in the same layer, and whether or not multiple exposure to light or multiple processing is to be used or not is determined. When a pattern arrangement in an arbitrary form, for example SOC or the like, is presupposed, a pattern for a region having such dimensions that k1>approximately 0.35 in the resolution (CD=k1×wavelength of light for exposure/NA) is generally formed as a resist pattern through one-time exposure to light in a process that is built, and it is difficult to transcribe a pattern for a region having dimensions corresponding to k1<approximately 0.35 (the minimum pattern arrangement pitch becomes CD×2) through one-time exposure to light, and therefore, the mask pattern is in some cases divided so that the pitch in the arrangement needs not be so precise.

However, the present embodiment is characterized in that the mask pattern is divided on the basis of the density of the pattern in different layers, in order to determine whether or not multiple exposure to light or multiple processing is used. That is to say, in the case where an active region pattern 1 having a corner portion with an external angle of 90 degrees and a gate pattern 2 which overlaps and is processed after being positioned against the corner portion of this active region pattern 1 are in such a relationship as to be proximate to each other, as in the MOS transistor shown in the present embodiment, it is determined that the mask pattern is divided so that multiple exposure to light and multiple processing are carried out.

FIGS. 2A to 3C are diagrams showing the process for exposure to light using a divided mask pattern in order to form the active region pattern 1, and are described in the following.

FIG. 2A is a diagram showing a first mask, and a first mask pattern (mask pattern 3) of the first mask includes a region corresponding to the first divided pattern including a first side 1a when the active region pattern 1 is divided.

FIG. 3A is a diagram showing a second mask, and a second mask pattern (mask pattern 5) of the second mask includes a region corresponding to the second divided pattern including a second side 1b where the active region pattern 1 is divided.

Next, FIG. 2B shows the result of an optical image simulation in the case where an image of the mask pattern 3 of FIG. 2A is formed on a substrate using a stepper, and FIG. 3B shows the result of an optical image simulation in the case where an image of the mask pattern 5 of FIG. 3A is formed on a substrate using a stepper.

Next, FIG. 2C is a diagram showing a resist pattern 4 where the mask pattern 3 of FIG. 2A is transcribed onto a substrate using a stepper, and FIG. 3C is a diagram showing a resist pattern 6 where the mask pattern 5 of FIG. 3A is transcribed onto a substrate using a stepper.

Next, a film to be processed on a substrate is processed twice and synthesized using these two resist patterns, and then, a pattern 7 where the corner portion is not rounded, as shown in FIG. 4, can be obtained.

Here, a portion which overlaps in the vicinity of the border region where the two patterns overlap (vicinity of the divided regions) is added, and thus, such effects are obtained that the transcription pattern is prevented from being divided, due to a shift in the overlap when the respective patterns are formed on the substrate through exposure to light.

As described above, when the pattern transcribing method according to the present embodiment is used, the active region pattern 1 having a corner portion with an external angle of 90 degrees shown in FIG. 1 can be formed.

Next, a method for forming an active region pattern 1 in the case where the active region pattern 1 is formed without dividing the mask pattern is described below.

For the sake of comparison, a mask pattern 8 having a corner portion with an external angle of 90 degrees is shown in FIG. 5A, the results of optical image simulation in the case where an image of this mask pattern 8 is formed on a substrate using a stepper is shown in FIG. 5B, and the pattern 9 transcribed onto the substrate is shown in FIG. 5C.

It can be seen from the figures that the corner portion with 90 degrees in the layout of the mask pattern 8 is rounded when projected onto a substrate. Therefore, the corners are rounded in the transcription pattern 9.

Figure 7A:
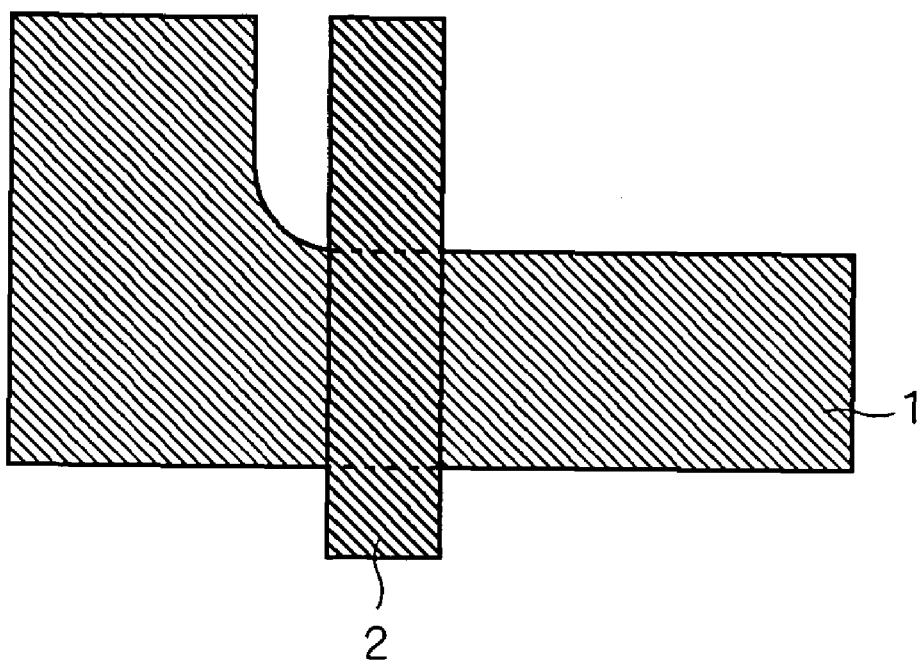
FIGS. 7A and 7B are diagrams showing a pattern transcribed through the step of exposure to light according to the related art.

In addition, in FIG. 6, optical proximity effect correction (OPC) is carried out, in order to make the form of the transcription pattern as close as possible to the design pattern so as to obtain the mask pattern 8 shown in FIG. 7A, and thus, correction for preventing rounding in the corners is carried out. In general, this mask pattern 8 is generated through computer processing, referred to as rule base OPC or model base OPC, and in some cases, this mask pattern 8 is arranged through manual arrangement. By optimizing the mask pattern in this manner, the corner portions can be prevented from being rounded in comparison with FIGS. 5A to 5C. In the case where a light source for ultraviolet rays and far ultraviolet rays where the wavelength of light for exposure is 248 nm or 193 nm is used, however, even after correction, the corners remain rounded in a range of approximately 100 nm.

Figure 7B:
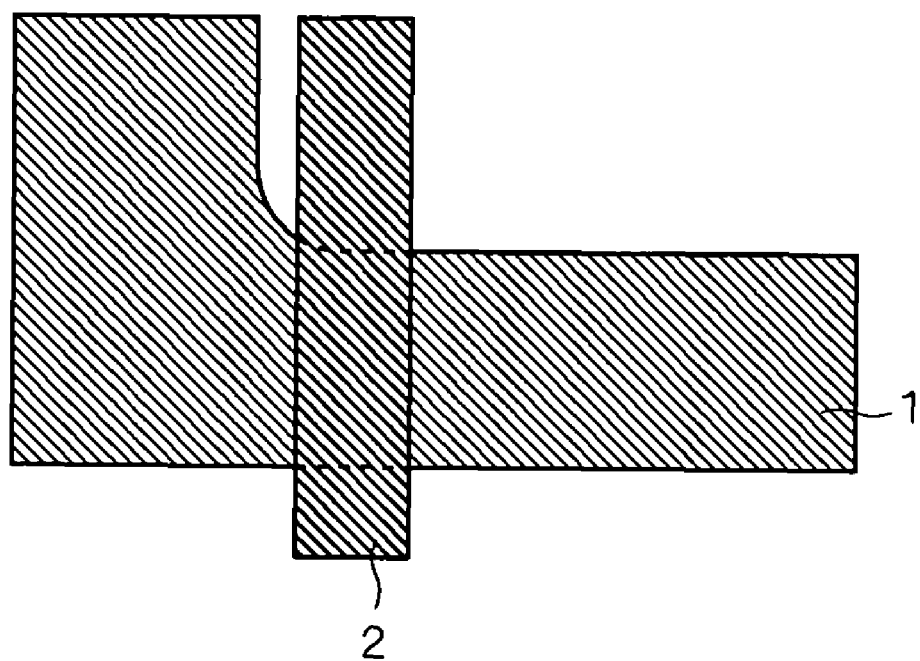

When FIGS. 4 to 6C are compared in this manner, it can be seen that the corner portions in the active region pattern can be significantly prevented from being rounded in FIG. 4, where the present first embodiment is used. When the corner portions in the active region pattern 1 are rounded, as shown in FIGS. 5A to 6C, the gate pattern 2 and the active region pattern 1 are shifted from each other in position when the gate pattern 2 is positioned, and thus, the positions of the pattern relative to each other fluctuate, as shown in FIG. 7A or 7B. As a result, the length of the gate fluctuates as the patterns shift when they overlap, due to the form of the corner portions, which are rounded, and thus, the properties of the transistors become inconsistent.

As described above, according to the present embodiment, it is determined whether or not multiple exposure to light or multiple processing is used by dividing the mask pattern on the basis of the density of the pattern in different layers, and thus, the corner portions in the active region pattern can be prevented from being rounded, and the gate pattern which is positioned and overlaps the active region pattern which is then processed can be prevented from shifting in position, and the properties of the transistors can be prevented from fluctuating.

Second Embodiment

FIGS. 8A to 9C are diagrams showing a process for a pattern with a low density arrangement having two adjacent sides forming a corner portion and a pattern with a high density arrangement on a substrate for a semiconductor device, and the present second embodiment is characterized in that when the different mask patterns in two directions shown in the first embodiment are used for transcription, a mask pattern for the pattern with a high density arrangement is divided at the same time for transcription. This is described in the following with reference to the drawings.

Figure 8A:
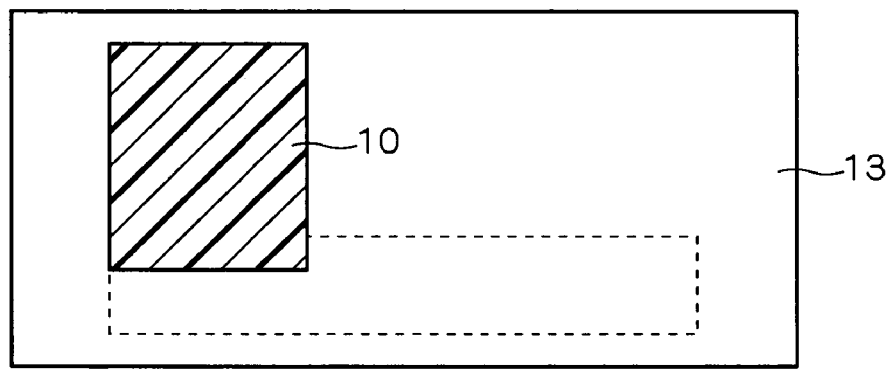
FIGS. 8A to 8C are diagrams illustrating the pattern transcribing method according to the second embodiment of the present invention.
Figure 8B:
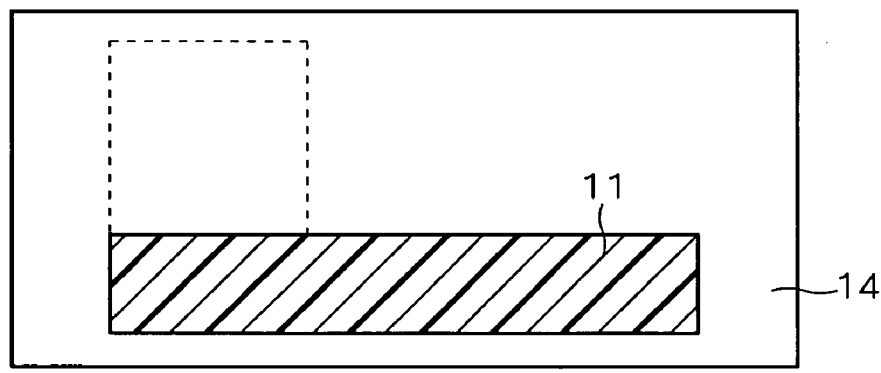
Figure 8C:
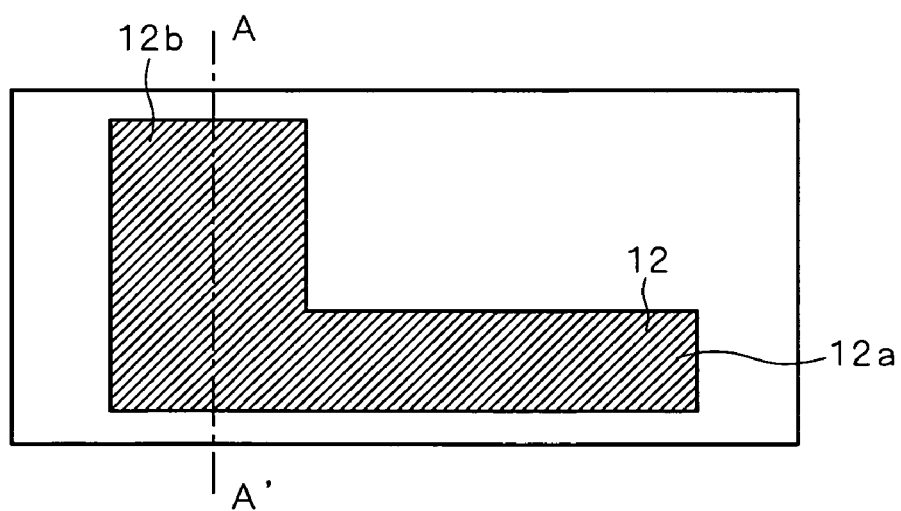
Figure 9A:
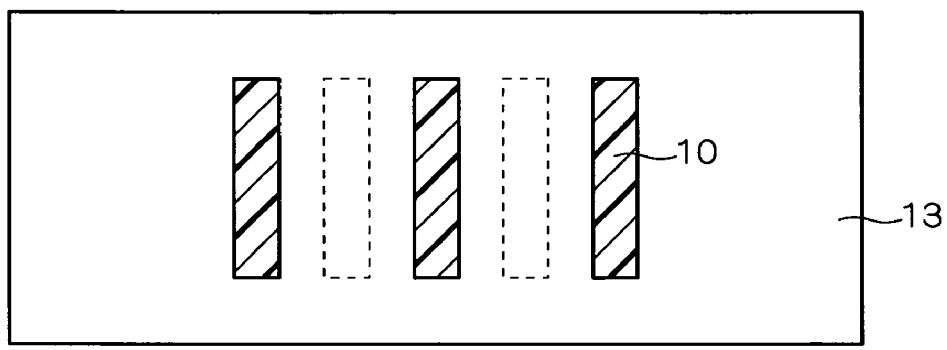
FIGS. 9A to 9C are diagrams illustrating the pattern transcribing method according to the second embodiment of the present invention.
Figure 9B:
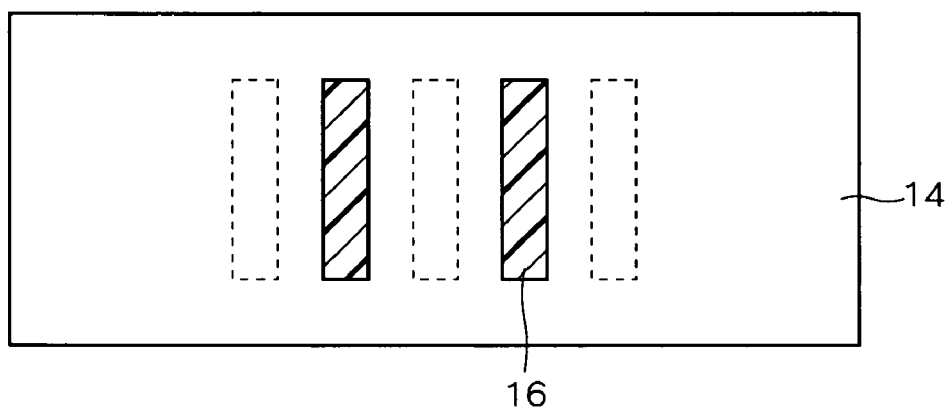
Figure 9C:
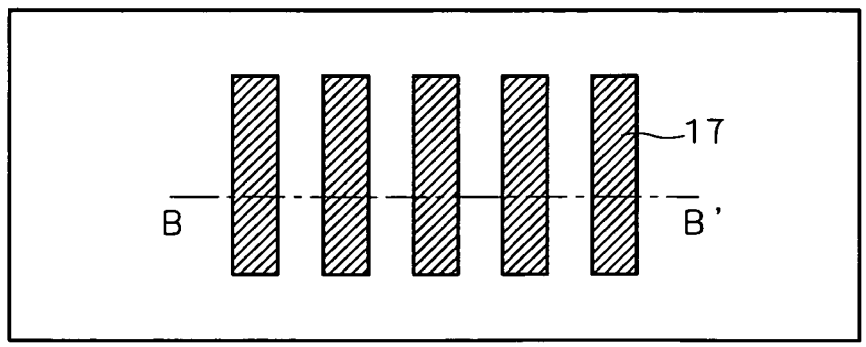

FIGS. 8C and 9C show a pattern desired to be transcribed, and these are formed in the same layer. A pattern 12 shown in FIG. 8C is an isolated pattern with a low density arrangement where intervals between adjacent areas are relatively wide. A pattern 17 shown in FIG. 9C is periodically with a high density arrangement where the intervals between adjacent lines are relatively narrow. According to the present embodiment, this pattern 12 includes first and second sides 12a and 12b which are adjacent, forming a corner portion with an external angle of 90 degrees in the axis x and axis y, and may include first and second sides which are adjacent, forming a corner portion with an external angle of less than 180 degrees. In addition, the minimum pattern arrangement pitch in the periodic pattern according to the present embodiment is 130 nm, and the above described k1 value is approximately 0.31 under the below described conditions for the ArF scanner stepper. In addition, the distance between the patterns 12 and the patterns 17 is greater than the distance between the respective patterns 17.

FIGS. 8A and 9A show a first mask pattern which includes a mask pattern 10 and a mask pattern 15 formed in the first mask (mask 13), and the mask pattern 10 includes a region which corresponds to a divided pattern including a second side 12b where the pattern 12 is divided and the mask pattern 15 includes a region which corresponds to a first thinned out pattern from which the pattern 17 has been thinned out.

FIGS. 8B and 9B show a second mask pattern which includes a mask pattern 11 and a mask pattern 16 formed in a second mask (mask 14), and the mask pattern 11 includes a region which corresponds to a divided pattern including a first side 12a when the pattern 12 is divided and the mask pattern 16 includes a region which corresponds to a second thinned out pattern from which the pattern 17 has been thinned out.

The first mask 13 and the second mask 14 are transcribed through exposure to light and processing using the above described mask pattern, and thus, patterns 12 and 17 can be formed in the same layer. Here, the method for transcribing the pattern including two adjacent sides forming a corner portion is the same as in the first embodiment, and therefore, the description thereof is omitted.

Next, the respective steps are described with reference to FIGS. 10A to 11I.

FIGS. 10A to 11I are diagrams schematically showing the structure of a substrate in a cross section during the respective steps in a process flow according to the embodiment of the present invention, and the respective steps are described below.

Here, FIGS. 10A to 10I show cross sections along line A-A' in FIG. 8C, and FIGS. 11A to 11I show cross sections along line B-B' in FIG. 9C. In addition, FIGS. 10A to 11I show the steps carried out on the same substrate.

Figure 11I:
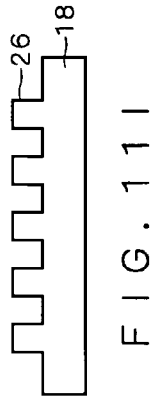
FIGS. 11A to 11I are diagrams showing the pattern transcribing process according to the second embodiment of the present invention.
Figure 11E:
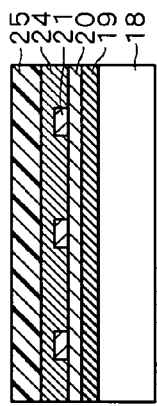
Figure 11F:
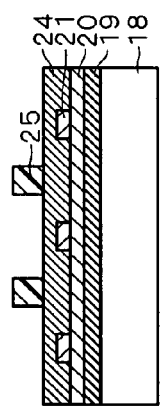
Figure 11G:
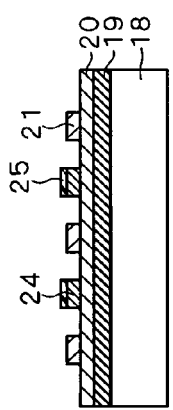
Figure 11H:
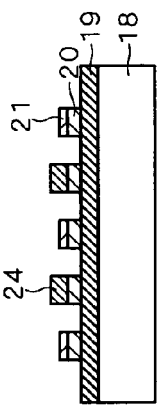
Figure 11A:
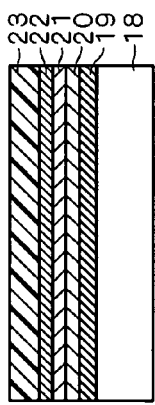

A silicon nitride film 19 (film thickness: 150 nm), a first hard mask 20 (polysilicon, film thickness: 150 nm), a second hard mask 21 (silicon oxide, film thickness: 150 nm), an organic reflection preventing film 22 (ARC-29A, made by Brewer Science Inc., film thickness: 78 nm), and a resist film 23 (SAIL-X121, made by Shin-Etsu Chemical Co., Ltd., film thickness: 200 nm) were layered on top of a silicon substrate 18 in this order (FIG. 10A, FIG. 11A).

Figure 11B:
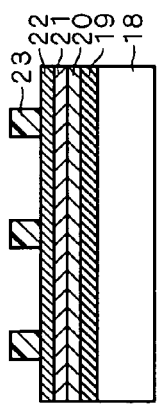
Figure 11C:
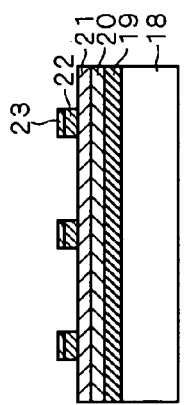

Next, a desired resist pattern is formed on this substrate through exposure to light through the first mask pattern and development using an ArF scanner stepper (wavelength of light for exposure: 193 nm, NA=0.93) (FIG. 10B, FIG. 11B).

Figure 11D:
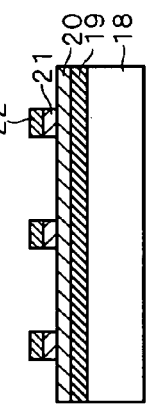

Next, an organic reflection preventing film 22, which is a base, is selectively etched using this resist pattern as a mask (FIG. 10C, FIG. 11C), and the second hard mask 21 is selectively etched and processed under predetermined conditions (FIG. 10D, FIG. 11D).

Next, an organic reflection preventing film 24 and a resist film 25 are again layered in this order (FIG. 10E, FIG. 11E), the second mask pattern is positioned relative to the resist pattern that has been transferred using the first mask pattern so as to overlap, and exposed to light, and furthermore, a predetermined developing process is carried out, so that a desired resist pattern is formed (FIG. 10F, FIG. 11F). Here, a reference pattern for positioning may be formed on a substrate in advance following the design rule, and the first mask pattern and the second mask pattern may be positioned relative to this reference pattern in such a manner as to overlap before exposure to light.

Next, the organic reflection preventing film 24 is selectively etched using the formed resist pattern as a mask (FIG. 10G, FIG. 11G), the first hard mask 20 is selectively using the formed resist pattern and the second hard mask pattern as a mask (FIG. 10H, FIG. 11H), and furthermore, the silicon nitride film 19, which is the base, is selectively etched using the first hard mask pattern and the second hard mask pattern as a mask.

Next, the silicon substrate 18 is etched to a depth of 150 nm, and the first hard mask 20, the second hard mask 21 and the silicon nitride film 19 are thinned out, so that a desired pattern 26 can be formed on the silicon substrate 18 (FIG. 10I, FIG. 11I).

As described above, the respective steps of FIGS. 10A to 11I are carried out on the same substrate, and thus, the patterns of FIG. 8C and FIG. 9C can be formed in the same layer.

Figure 12A:
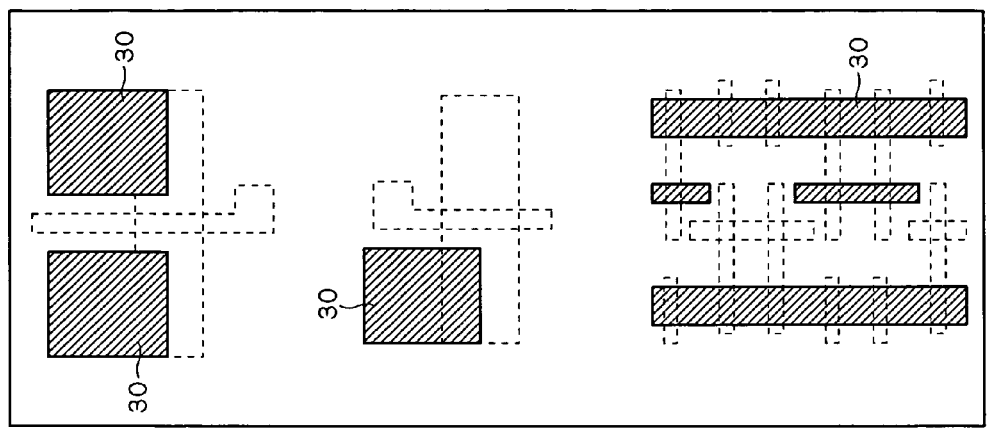
FIGS. 12A to 12C are diagrams showing the pattern transcribing process according to the second embodiment of the present invention.
Figure 12B:
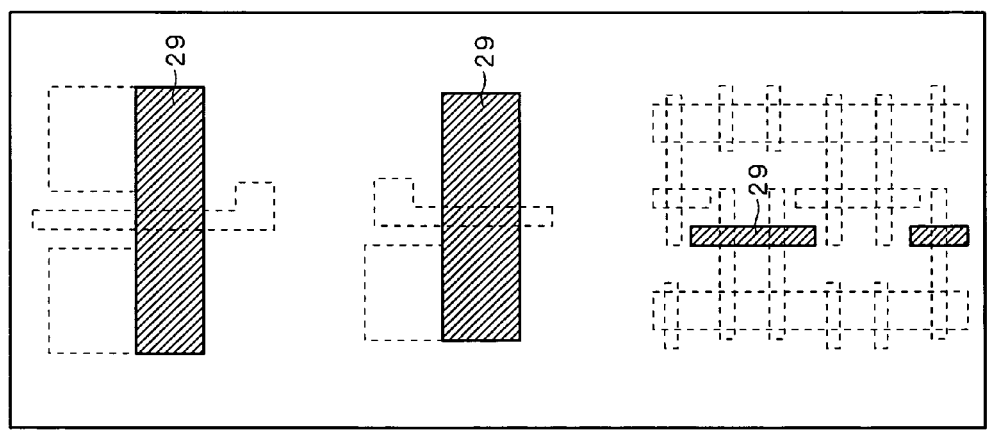
Figure 12C:
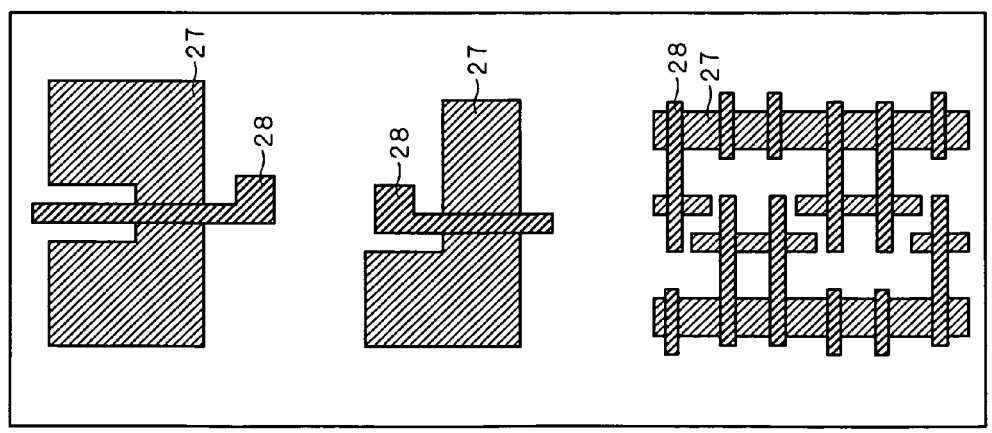

FIGS. 12A to 12C are diagrams showing an example of a circuit pattern formed in the above described steps, and the active region pattern and the gate pattern shown in the first embodiment are formed. FIG. 12B and FIG. 12C are mask patterns formed in the same mask, and show examples of mask patterns obtained by dividing the active region pattern 27 shown in FIG. 12A for the purpose of transcription. The two patterns on the upper side are divided in such a manner that the pattern edge in the direction x and the pattern edge in the direction y sandwiching a corner portion are transferred through different mask patterns, and the bottom pattern shown in the figures is obtained by dividing the pattern for the purpose of making it unnecessary for the pattern pitch to be precise.

As described above, the mask pattern is divided on the basis of the density of the patterns in the same layer and in different layers, and whether or not multiple exposure to light and multiple processing are used is determined, and thus, a mask pattern can be formed on the same mask and the predetermined circuit pattern shown in FIG. 12A can be obtained.

Here, in the same manner as in the first embodiment, a portion which overlaps the vicinity of the border region (vicinity of the divided regions) where the two patterns overlap is added, and thus, such effects are obtained that the transcription pattern can be prevented from being divided through shifting when respective overlapping patterns are transferred onto the substrate through exposure to light.

In addition, although in the present embodiment, the pattern in FIG. 12B and the pattern in FIG. 12C are for different masks, it is possible to prepare these on the same mask substrate by dividing the region, and thus, the cost can be reduced.

While the invention has been shown and described in detail, the foregoing description is in all aspects illustrative and not restrictive. It is therefore understood that numerous modifications and variations can be devised without departing from the scope of the invention.

What is claimed is:

1. A manufacturing method for a semiconductor device, wherein said semiconductor device comprises in the same layer:

an isolated patterned area arranged with low density where intervals between adjacent areas are relatively wide; and periodically patterned areas arranged with high density where intervals between adjacent areas are relatively narrow, wherein said isolated patterned area includes first and second sides, the first and second sides are adjacent to each other and form a corner portion of an external angle of less than 180-degrees, said manufacturing method comprises the steps of:

(a) exposing regions corresponding to a first divided pattern and first thinned out patterns formed by using a first mask having a first mask pattern, the first divided pattern includes said first side and is obtained by dividing said isolated patterned area, and the first thinned out patterns are obtained by thinning out said periodically patterned areas; and (b) exposing regions corresponding to a second divided pattern and second thinned out patterns formed by using a second mask having a second mask pattern, the second divided pattern includes said second side and is obtained by dividing said isolated patterned area, and the second thinned out patterns are obtained by thinning out said periodically patterned areas, wherein said first mask pattern and said second mask pattern have a region which overlaps in the vicinity of a divided portion, wherein the isolated patterned area is an active pattern, a part of the active pattern is formed by the first mask pattern, a part of the active pattern is formed by the second mask pattern, and the region which overlaps in the vicinity of the divided portion is masked in common through exposure to light by using the first and second mask patterns.

2. The manufacturing method for a semiconductor device according to claim 1, wherein said semiconductor device further comprises a gate pattern arranged above said isolated patterned area and in proximity to said corner portion, wherein said isolated patterned area is a patterned active region as the active pattern.

3. The manufacturing method for a semiconductor device according to claim 1, wherein said steps (a) and (b) comprise the step of transferring said first and second mask patterns to a hard mask.

4. The manufacturing method for a semiconductor device according to claim 1, wherein said first mask and said second mask are provided by forming separate regions of said first and second mask patterns on the same mask substrate.

5. A manufacturing method for a semiconductor device, wherein said semiconductor device comprises:

a patterned active region, including first and second sides, the first and second sides are adjacent to each other and form a corner portion of an external angle of less than 180 degrees; and a patterned gate arranged above said patterned active region and in proximity to said corner portions, said manufacturing method comprising the steps of:

(a) exposing a region corresponding to a first divided pattern formed by using a first mask having a first mask pattern, the first divided pattern which includes said first side and is obtained by dividing the patterned active region; and (b) exposing a region corresponding to a second divided pattern formed by using a second mask having a second mask pattern, the second divided pattern which includes said second side and is obtained by dividing the patterned active region, wherein said first mask pattern and said second mask pattern have a region which overlaps in the vicinity of a divided portion, and wherein a part of the patterned active pattern is formed by the first mask pattern, a part of the patterned active pattern is formed by the second mask pattern, and the region which overlaps in the vicinity of the divided portion is masked in common through exposure to light by using the first and second mask patterns.

6. The manufacturing method for a semiconductor device according to claim 5, wherein said semiconductor device further comprises periodically patterned areas arranged with high density where intervals between adjacent areas are relatively narrow in the same layer as said patterned active region, said patterned active region is isolated patterned areas arranged with a low density where intervals between adjacent areas are relatively wide, said step (a) includes the step of exposing regions corresponding to the first divided pattern and first thinned out patterns formed by using the first mask having the first mask pattern, the first divided pattern is obtained by dividing said isolated patterned areas, and the first thinned out patterns are obtained by thinning out said periodically patterned areas, and said step (b) includes the step of exposing regions corresponding to the second divided pattern and second thinned out patterns formed by using a second mask having a second mask pattern, the second divided pattern is obtained by dividing said isolated patterned areas, and the second thinned out patterns which are obtained by thinning out said periodically patterned areas.

7. A manufacturing method for a semiconductor device, wherein said semiconductor device comprises:

a patterned active region including first and second sides, the first and second sides are adjacent to each other and form a corner portion of an external angle of less than 180 degrees; and a patterned gate arranged above said patterned active region and in proximity to said corner portion, said manufacturing method comprising the steps of:

(a) exposing a region corresponding to a first divided pattern formed by using a first mask having a first mask pattern, the first divided pattern includes said first side and is obtained by dividing the patterned active region; and (b) exposing a region corresponding to a second divided pattern formed by using a second mask having a second mask pattern, the second divided pattern includes said second side and is obtained by dividing patterned active region, wherein said first mask pattern and said second mask pattern have a region which overlaps in the vicinity of a divided portion, and wherein a part of the patterned active pattern is formed by the first mask pattern, a part of the patterned active pattern is formed by the second mask pattern, and the region which overlaps in the vicinity of the divided portion is masked in common through exposure to light by using the first and second mask patterns.

8. A manufacturing method for a semiconductor device, wherein said semiconductor device comprises in the same layer:

an isolated patterned area where intervals between adjacent areas are first intervals; and periodically patterned areas where intervals between adjacent areas are smaller than those of said isolated patterned area, wherein said isolated patterned area includes first and second sides, the first and second sides are adjacent to each other and form a corner portion with an external angle of less than 180 degrees, said manufacturing method comprises the steps of:

(a) exposing regions corresponding to a first divided pattern and first thinned out patterns formed by using a first mask having a first mask pattern, the first divided pattern includes said first side and is obtained by dividing said isolated patterned area, and the first thinned out patterns are obtained by thinning out said periodically patterned areas; and (b) exposing regions corresponding to a second divided pattern and second thinned out patterns formed by using a second mask having a second mask pattern, the second divided pattern includes said second side and is obtained by dividing said isolated patterned area, and the second thinned out patterns are obtained by thinning out said periodically patterned areas, wherein said first mask pattern and said second mask pattern have a region which overlaps in the vicinity of a divided portion, and wherein the isolated patterned area is an active pattern, a part of the active pattern is formed by the first mask pattern, a part of the active pattern is formed by the second mask pattern, and the region which overlaps in the vicinity of the divided portion is masked in common through exposure to light by using the first and second mask patterns.

* * * * *